US007193299B2

United States Patent
Arndt et al.

(10) Patent No.: US 7,193,299 B2
(45) Date of Patent: Mar. 20, 2007

(54) CONDUCTOR FRAME AND HOUSING FOR A RADIATION-EMITTING COMPONENT, RADIATION-EMITTING COMPONENT AND DISPLAY AND/OR ILLUMINATION SYSTEM USING RADIATION-EMITTING COMPONENTS

(75) Inventors: Karlheinz Arndt, Regensburg (DE); Georg Bogner, Lappersdorf (DE); Gunter Waitl, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 137 days.

(21) Appl. No.: 10/487,576

(22) PCT Filed: Aug. 2, 2002

(86) PCT No.: PCT/DE02/02866

§ 371 (c)(1),
(2), (4) Date: Aug. 23, 2004

(87) PCT Pub. No.: WO03/019677

PCT Pub. Date: Mar. 6, 2003

(65) Prior Publication Data

US 2004/0262717 A1   Dec. 30, 2004

(30) Foreign Application Priority Data

Aug. 21, 2001  (DE) .................... 101 40 831
Nov. 26, 2001  (DE) .................... 101 57 909

(51) Int. Cl.
*H01L 23/495* (2006.01)
*H01L 31/0203* (2006.01)

(52) U.S. Cl. ............. 257/669; 257/674; 257/666; 257/433; 257/E23.045
(58) Field of Classification Search ........... 257/674, 257/669, 666, 433
See application file for complete search history.

(56) References Cited

U.S. PATENT DOCUMENTS

| 5,040,868 A | 8/1991 | Waitl et al. |
| 5,874,748 A | 2/1999 | Osawa |
| 2002/0089064 A1 | 7/2002 | Wu |

FOREIGN PATENT DOCUMENTS

| DE | 38 35 942 A1 | 10/1988 |
| DE | 38 35 942 A | 4/1990 |
| EP | 0 274 313 A | 7/1988 |
| EP | 0 400 176 B1 | 5/1989 |
| EP | 0 590 336 A | 4/1994 |
| EP | 1 111 738 A | 6/2001 |
| JP | 57 066656 A | 4/1982 |
| JP | 60 066454 A | 8/1985 |
| JP | 08288555 A | 11/1996 |
| JP | 2001 024237 A | 5/2001 |

*Primary Examiner*—Nitin Parekh
(74) *Attorney, Agent, or Firm*—Cohen, Pontani, Lieberman & Pavane LLP

(57) ABSTRACT

A leadframe for a surface-mountable radiation-emitting component, preferably a light-emitting diode component, having at least one chip connection region and at least one external connection strip. The leadframe is formed in planar fashion and a deformation element, preferably a spring element, is arranged between the chip connection region and the external connection strip. The deformation element enables an elastic or plastic deformation of the leadframe in the plane of the leadframe. A housing, a surface-mountable component and an arrangement having a plurality of such components are furthermore specified.

40 Claims, 5 Drawing Sheets

CONDUCTOR FRAME AND HOUSING FOR A RADIATION-EMITTING COMPONENT, RADIATION-EMITTING COMPONENT AND DISPLAY AND/OR ILLUMINATION SYSTEM USING RADIATION-EMITTING COMPONENTS

This is a U.S. national stage of application No. PCT/DE02/02866, filed on 2 Aug. 2002.

This patent application claims the priority of German patent applications 10140831.5 and 10157909.8, the disclosure content of which is hereby incorporated by reference.

FIELD OF THE INVENTION

The invention relates to a leadframe, for a surface-mountable radiation-emitting component having at least one chip connection region and at least one external soldering connection strip electrically connected to the latter, a housing for such a component, a surface-mountable radiation-emitting component, and to a display and/or illumination arrangement with a plurality of radiation-emitting components.

BACKGROUND OF THE INVENTION

Figure 7:
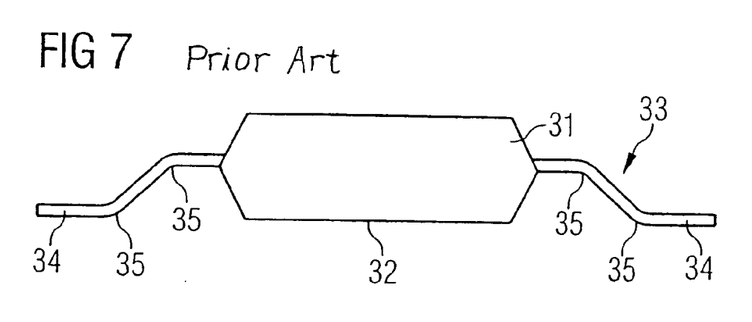
FIG. 7 shows a surface-mountable component according to the prior art.

A radiation-emitting component of the type mentioned is illustrated diagrammatically in FIG. 7 and described for example in EP 0 400 176 A1. The component has a housing base body 31 with a mounting area 32, in which a leadframe 33 is embedded. Parts of the leadframe 33 are formed as connection strips which project from the housing base body 31 and, as they proceed further, are bent such that their connection areas 34 lie in one plane with the mounting area 32, which defines the mounting plane of the component. The bends 35 in the connection strips impart certain elastic properties to the connection strips, so that, on the one hand, a stable, tilting-free bearing of the component, for example on a printed circuit board, is ensured and, on the other hand, mechanical stresses which may arise in particular when the component is soldered in are elastically absorbed. Since changes in temperature are generally unavoidable when the component is soldered in and also during operation or avoiding them at least requires a high outlay, a certain elasticity of the component, in particular a flexibility of the connection strips, cannot be dispensed with.

Furthermore, the connection strips have to be formed such that components which are packed as bulk material do not interlock in one another. Finally, a sufficiently stable fixing of the component has to be ensured by the connection strips.

However, the known bent embodiment of the connection strips increases the space requirement for such a component both vertically and horizontally. In the horizontal direction, a certain minimum distance between the connection areas 34 and the housing base body 31 is prescribed by the stretched S-shaped bends 35. Reducing said minimum distance would require a higher degree of bending of the leadframe 33 and thus increase the risk of components interlocking in one another. Moreover, the bend 35 of the leadframe 33 toward the mounting area 32 of the component increases the volume taken up by the component and defines the minimum height of the component in its mounted state.

The space requirement is to be kept as small as possible in the case of very small structural forms which, for example, are intended to enable a high packing density and/or planar design and/or a mounting in round conductor track holes, that is to say holes.

SUMMARY OF THE INVENTION

It is an object of the present invention to provide a leadframe and a housing for a radiation-emitting surface-mountable component and a radiation-emitting surface-mountable component and also a display and/or illumination arrangement having radiation-emitting surface-mountable components with a small space requirement in each case.

Another object of the invention is to provide a leadframe which has a sufficient elasticity in conjunction with sufficient mechanical stability.

These and other objects are attained in accordance with one aspect of the invention directed to a leadframe for a surface-mountable radiation-emitting component having at least one chip connection region and at least one external soldering connection strip electrically connected to the latter. The leadframe is adapted to be mounted in a mounting plane of a component housing. A deformation element is formed between the chip connection region and the soldering connection strip, which deformation element runs substantially in a plane of the soldering connection strip. The deformation element enables a movement of the soldering connection strip relative to the chip connection region in a direction parallel to the mounting plane of the component housing.

The invention is based on the idea of forming the leadframe for a radiation-emitting component in planar fashion to the greatest possible extent in particular in the region outside a housing, and in the process forming it so as to elastically or plastically absorb strains resulting from deformation in the plane of the leadframe. In this case, parts of the leadframe at the same time form the bearing area of the component.

In an advantageous refinement of the invention, the leadframe has two or more connection strips, a deformation element or spring element in each case being arranged between connection strip and the chip connection region. In a preferred embodiment, the deformation element runs completely in one and the same plane as the soldering connection strip.

The planar embodiment of the leadframe advantageously makes it possible to form a component which has, perpendicular to the leadframe plane, only very small housing extents and only very small space requirements. Furthermore, the external connection area of the component can be arranged near to the component housing since the horizontal space requirement is very small on account of the planar embodiment. In this case, the deformation or spring elements ensure a sufficient flexibility relative to strains and deformations as may arise for example during the soldering-in process or on account of thermal loading during operation of the component.

The invention's embodiment of the leadframe, housing and component advantageously makes it possible to avoid having to bend leadframe parts only after production of a component housing. This is of importance particularly in the case of housing bodies produced by encapsulation by molding or encapsulation by injection-molding. The risk of delamination of housing and leadframe is thereby reduced, the advantage afforded by this being intensified particularly in the case of greatly miniaturized housings.

In an advantageous development of the invention, the deformation element is formed as a spring strip which is sufficiently narrow to ensure the required flexibility of the leadframe. Said deformation element is preferably made narrower than the adjoining connection strip and runs transversely with respect to the main direction of extent of the leadframe. What is achieved by this course of the spring strip is that mechanical stresses in the plane of the leadframe can be well cushioned largely independently of their direction. Furthermore, this embodiment enables the leadframe to be produced simply and cost-effectively by stamping out the leadframe from a metal sheet or a foil. Connection strips and adjoining deformation elements and also parts of the chip connection region are formed in one piece in this case and can be stamped from a metal sheet or a film in one work step.

In an advantageous development of the invention, the connection strip has a projection and/or a housing body has a projection or a groove which enables the connection strip to project into the housing body. This reduces the risk of bending of the leadframe or of the connection strips perpendicularly to the leadframe plane.

The chip connection region is preferably embodied in two parts with a chip connection part and a wire connection part, the chip connection part being provided for mounting a radiation-emitting chip. Further contact is made with the chip by means of a wire connection to the wire connection part.

Between the deformation or spring element and the chip connection region, the leadframe preferably has at least one holding element for fixing the chip connection region in a component housing. This serves in particular for strain relief of the chip connection region. Such a holding element is realized for example by means of a cutout or a hole in the leadframe, into which the component housing engages.

In an advantageous refinement of the invention, the leadframe is partly embedded in a housing, the deformation or spring elements with the adjoining connection strips being led out of the housing. Furthermore, the housing may have a radiation exit window in the form of a suitably formed recess in which the chip connection region of the leadframe is arranged. The side areas of the radiation exit window are preferably formed as a radiation reflector. As an alternative, the housing may also comprise a radiation-transmissive material and completely enclose the radiation-emitting chip.

A preferred development of a housing according to the invention has peripheral projections which, in plan view, partly overlap the deformation or spring elements of the leadframe. This advantageously reduces the risk of bending of the connection strips or of the deformation or spring elements perpendicularly to the leadframe plane.

In addition or as an alternative, it is possible to form projections at the connection strips, as already described, which project into the housing body.

In a particularly preferred embodiment, the housing body has an essentially circular or oval cross-sectional form parallel to the plane of the soldering connection strip.

In a radiation-emitting component according to the invention, a radiation-emitting chip, for example a semiconductor chip, is fixed on the chip connection region or the chip connection part of the leadframe. The semiconductor chip and parts of the leadframe are surrounded by a housing of the type described.

If the chip is arranged within a radiation exit window, then the latter may advantageously be filled with a transparent compound which encapsulates the chip, preferably a plastics compound. This encapsulation serves to protect the chip and additionally makes it possible to form an optical element arranged downstream of the radiation-emitting chip, for example in the form of a lens surface. Reaction resins such as epoxy resins, acrylic resins or silicone resins or a mixture of these resins are suitable, in particular, as the encapsulation.

Further features, advantages and expediencies of the invention are explained in more detail below using five exemplary embodiments.

DETAILED DESCRIPTION OF THE DRAWINGS

Identical or identically acting elements are provided with the same reference symbols in the figures.

Figure 1:
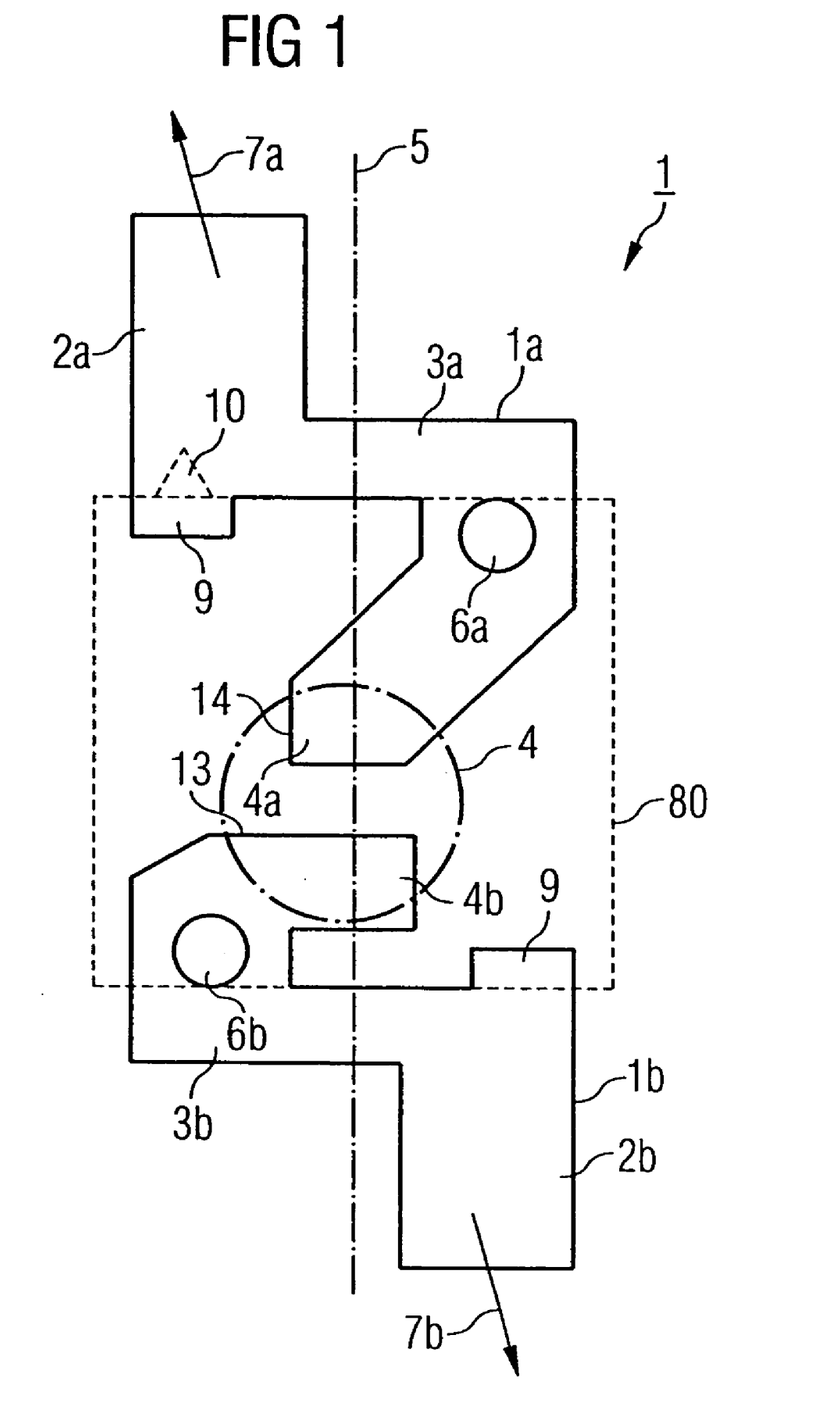
FIG. 1 shows a diagrammatic plan view of an exemplary embodiment of a leadframe according to the invention.

The leadframe 1 illustrated in FIG. 1 is embodied in planar fashion and in two parts. The two leadframe parts 1a and 1b each have a connection strip 2a, 2b joined by a deformation element 3a, 3b. The deformation element is preferably embodied as a spring element.

From the deformation elements 3a, 3b the two leadframe parts 1a, 1b extend to a chip connection region 4. In this case, by way of example, one of the two leadframe parts 1a projecting into the chip connection region 4 may be provided as chip connection part 14 with a mounting area for a chip, preferably a radiation-emitting semiconductor chip. The other leadframe part 1b may correspondingly be formed as a wire connection part 13 and have a wire connection area which serves for making the electrical contact with the chip.

The deformation elements or spring elements 3a, 3b are embodied in the form of narrow strips, the width of which is narrower than the width of the adjoining connection strips 2a, 2b. These spring strips run perpendicular to the longitudinal axis 5 of the leadframe 1, which coincides with the main direction of extent of the leadframe.

The shaping described imparts a flexibility to the planar leadframe 1, so that strains in the leadframe plane, for example due to tension in the directions 7a, 7b shown, as may occur during or after the soldering-in process on account of different thermal expansion coefficients, are absorbed by means of the deformation elements 3a, 3b. This prevents, in particular, a transfer of the stresses to parts of a housing body 80 (indicated by the dashed contour in FIG. 1) in which such a leadframe is embedded, which stresses can lead to cracks or other kinds of damage of the housing.

Circular holes 6a, 6b are furthermore formed in the leadframe 1, which holes improve the retention of the leadframe in a housing. Correspondingly formed pins of a housing body 80 can be passed through said holes 6a, 6b, and prevent a displacement of the leadframe within the housing to the greatest possible extent. If the housing body 80 is formed for example at least partly by the leadframe 1 being encapsulated with a molding compound, for example by means of an injection-molding or transfer-molding method, then the molding compound fills the holes, thereby forming the above-mentioned pins, which, in the solid state, provide for the additional retention of the leadframe in the housing.

Furthermore, the connection strip 2b has a projection 9, which enables the leadframe to be additionally projected into the housing body 80 and, in particular, serves to prevent bending of the connection strip 2b and/or the adjoining deformation element 3b out of the leadframe plane. In addition or as an alternative, a projection 10 at a housing may also serve for this purpose, as will be described in more detail below, said projection likewise preventing such bending.

Figure 2:
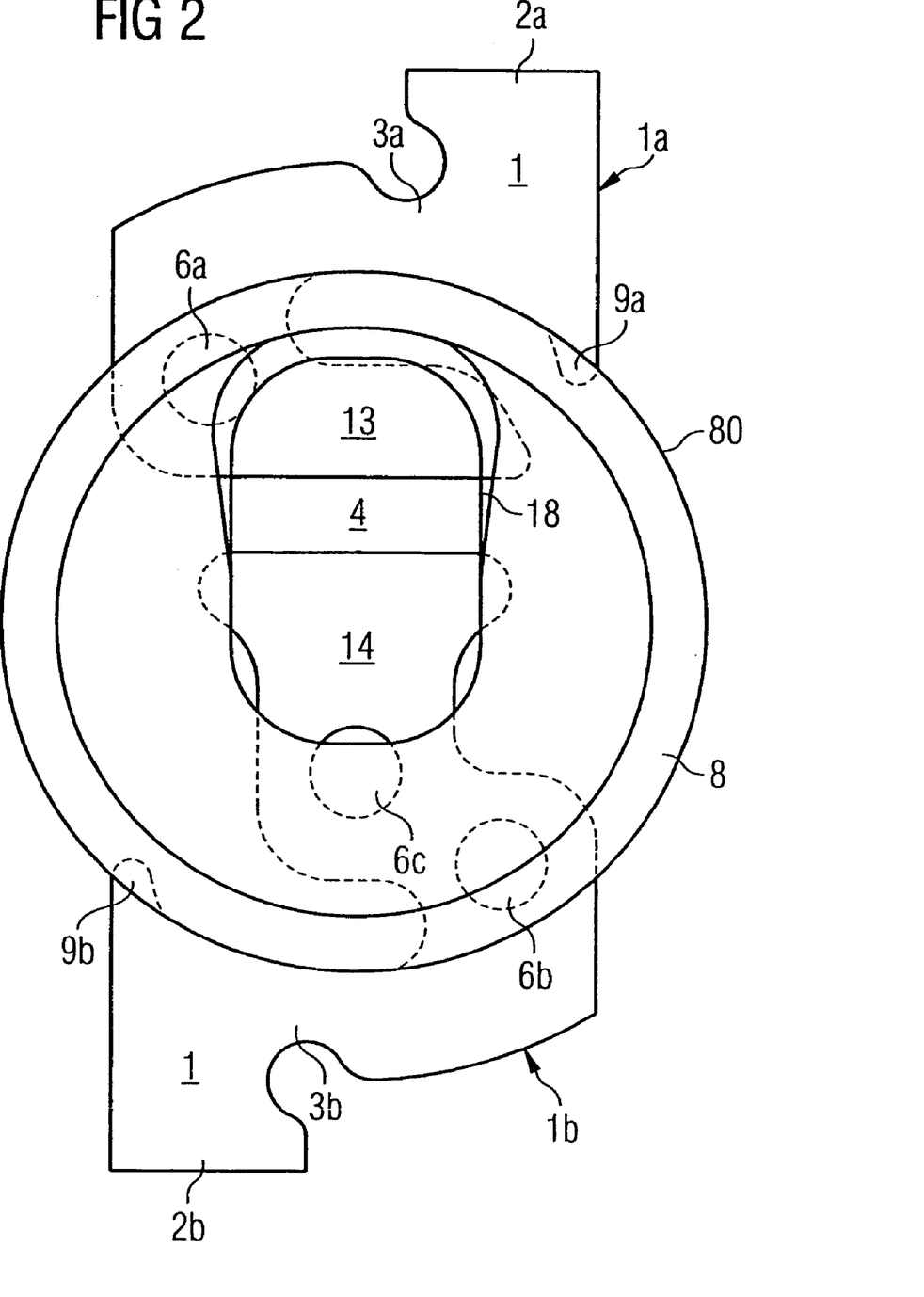
FIG. 2 shows a diagrammatic plan view of a first exemplary embodiment of a housing according to the invention.
Figure 3A:
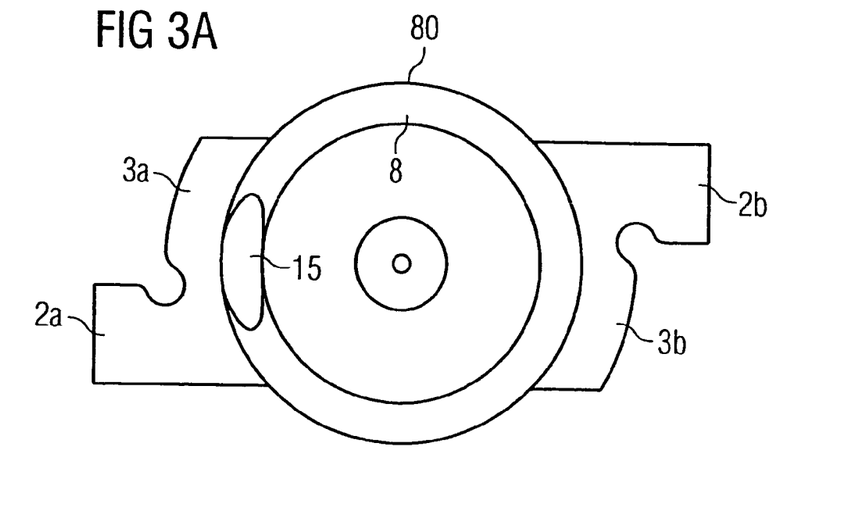
FIGS. 3a, 3b and 3c show a diagrammatic bottom view, side view and plan view of a second exemplary embodiment of a housing according to the invention.
Figure 3B:
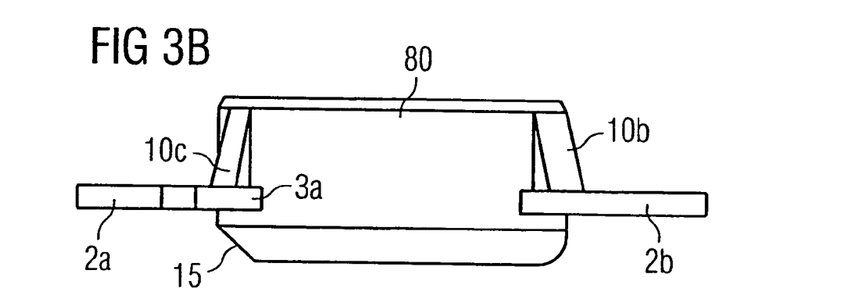
Figure 3C:
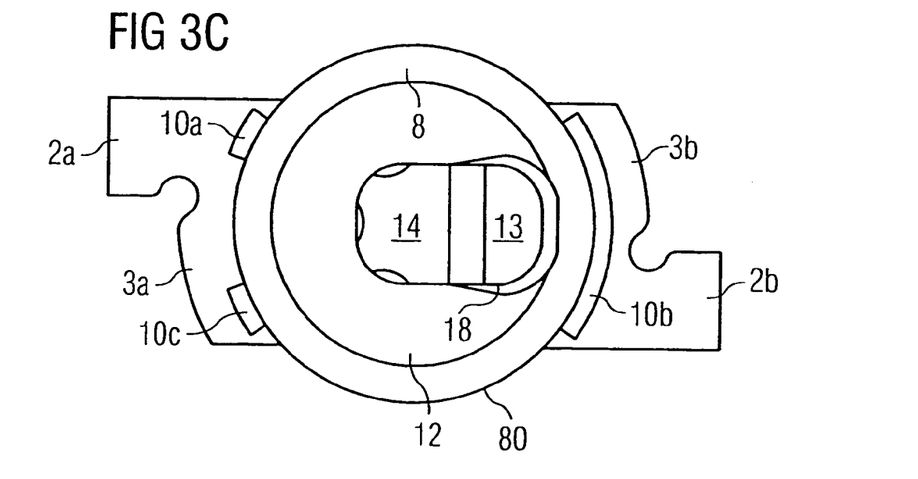
Figure 4:
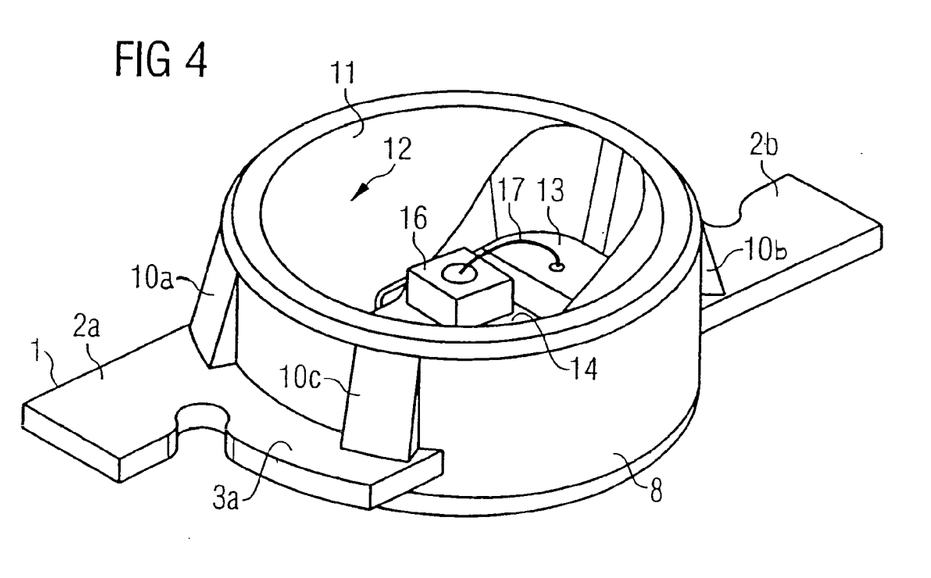
FIG. 4 shows a diagrammatic perspective view of the embodiment of a component according to the invention as shown in FIGS. 3a–3c.

FIGS. 2, 3 and 4 show a diagrammatic plan view of an exemplary embodiment of a housing according to the invention for a radiation-emitting component.

In this case, a housing body 80 comprises a housing base body 8 which is largely rotationally symmetrical concerning the outer contour and has a circular contour in the illustration, in which a leadframe 1 is partly embedded. The leadframe 1, as in the previous exemplary embodiment, is formed in planar fashion and in two parts, the two leadframe parts each having an external connection strip 2a, 2b and an adjoining deformation element 3a, 3b and also a chip connection part 14 or respectively a wire connection part 13. Chip connection part 14 and wire connection part 13 are arranged at a distance from one another in a common chip connection region 4 in the housing.

Furthermore, a projection 9a, 9b is in each case formed at the connection strips 2a, 2b, which projection projects into the housing base body 8 and thus prevents bending of the leadframe 1 perpendicularly to the leadframe plane.

The housing base body 8 preferably comprises a molding compound and is produced by the leadframe 1 being encapsulated with said molding compound, for example by means of an injection-molding or transfer-molding method. In this case, the molding compound also fills the holes 6a, 6b and 6c in the leadframe 1, thereby ensuring a mechanically stable anchoring of the leadframe 1 in the housing base body 8.

The housing base body 8 furthermore has a radiation exit window 12 in the form of a truncated-cone-like recess which extends in the direction of the main emission direction and into which the chip connection part 14 and the wire connection part 13 of the leadframe project, that is to say adjoin at least the internal space of the recess with a surface, and in particular form at least a part of the bottom area of the radiation exit window 12. For this purpose, a separate cutout 18 is formed in the radiation exit window 12, the base area of which cutout forms the chip connection region 4 and defines the mounting plane for a chip or a wire connection. Hole 6c, which is not shown in FIG. 1, has been introduced in FIG. 2 as an optional feature that is useful to improve the anchoring of leadframe 1 in the housing base body 8.

The side wall of the radiation exit window, which connects the bottom area of the recess to the outer area of the housing base body 8, is embodied in such a way that it acts as a reflector area for an electromagnetic radiation emitted by the chip 16. It may be planar or concave depending on the desired emission behavior.

The side wall is preferably embodied in such a way that the chip 16 is situated centrally in the reflector well formed by it, and that it is particularly preferably led essentially as far as the mounting region for the chip on the leadframe 1. This last means that only this mounting region alone essentially represents the entire bottom area of the truncated-cone-like recess. In other words, the bottom area is preferably only as large as is necessary for the chip mounting. In order to achieve this to the greatest possible extent, a cutout 18 for a wire connection 17 from the wire connection part 13 to the chip 16 is provided in the side wall (see FIG. 4).

FIGS. 3a to 3c show a further exemplary embodiment of a housing according to the invention. FIG. 3a illustrates the bottom view, FIG. 3b the side view and FIG. 3c the plan view of the housing.

In contrast to the previously described exemplary embodiments, projections 10a, 10b and 10c are arranged peripherally at the housing, and prevent bending of the leadframe 1 perpendicular to the leadframe plane (see FIGS. 3b and 3c). The housing is provided in particular for an LED component. For the marking of the cathode connection of the leadframe 1, the housing has, on one side, a bevel 15 and also two separate housing projections 10a, 10c, while a single wider projection 10b is integrally formed opposite.

In this case, the projections 10a, 10b and 10c are arranged in such a way that, in the plan view and in the bottom view, they overlap the deformation or spring elements 3a, 3b and thus prevent vertical bending of the deformation elements.

FIGS. 3 and 4 differ from FIG. 2 in terms of having projections 10a, 10b and 10c. FIG. 4 perspectively shows a radiation-emitting chip 16, for example a semiconductor chip such as a semiconductor LED or a semiconductor laser, that is fixed, for example soldered or adhesively bonded by means of an electrically conductive adhesive, on that region of the base area of the radiation exit window 12 which is formed by the chip connection part 14.

On the front side remote from the leadframe 1, the semiconductor chip 16 has a contact area from which a wire connection 17 is led to the wire connection part 13. The oblique side area 11 of the radiation exit window 12 serves as a reflector for a radiation emitted by the semiconductor chip 16 toward the side.

Figures 5, 6:
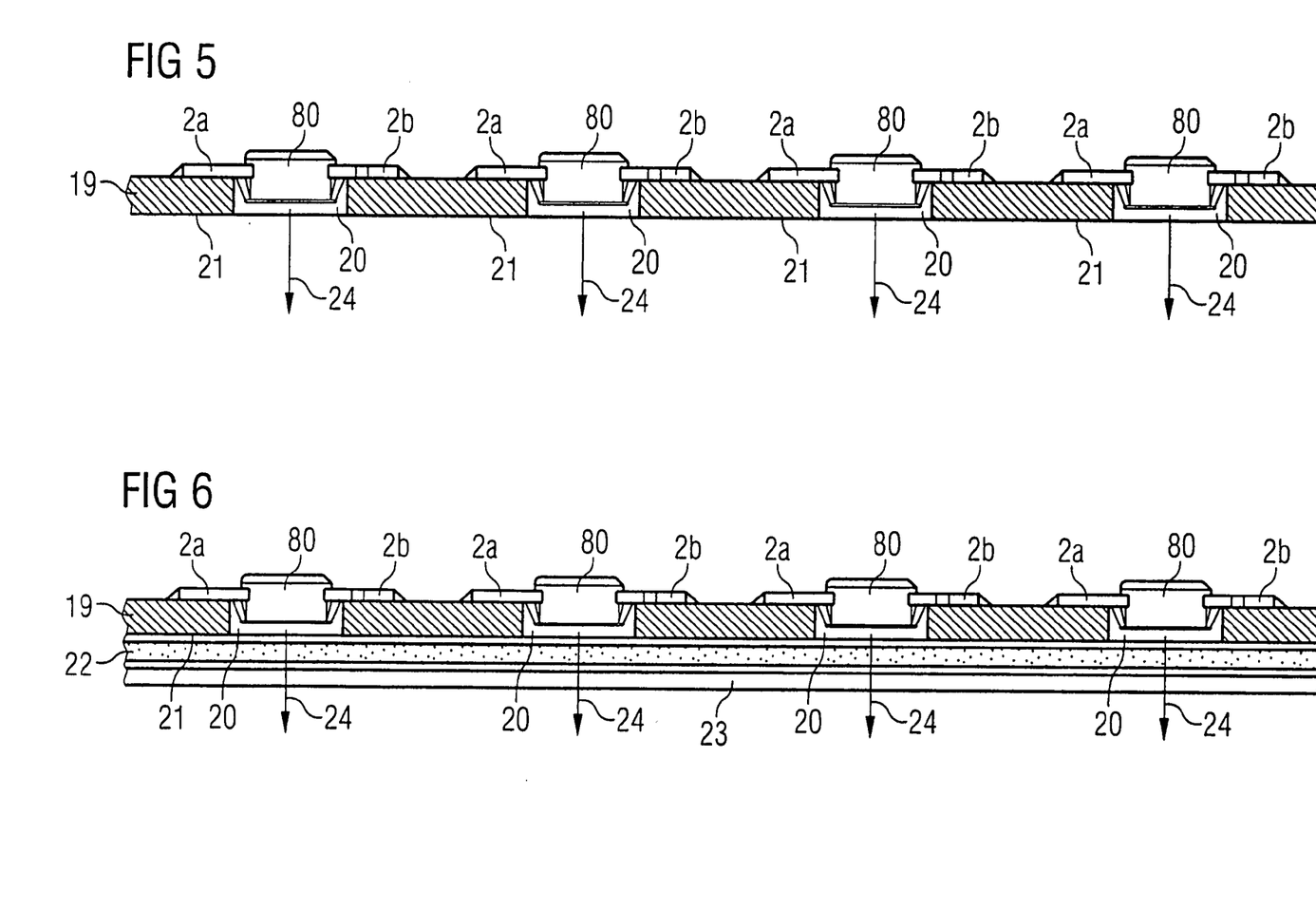
FIG. 5 shows a diagrammatic sectional view of a first exemplary embodiment of a multiple arrangement of radiation-emitting components according to the invention.
FIG. 6 shows a diagrammatic sectional view of a second exemplary embodiment of a multiple arrangement of radiation-emitting components according to the invention.

FIG. 5 shows a multiple arrangement of components according to the invention. A plurality of holes 20 are formed in a carrier 19, for example a circuit board. Furthermore, the carrier has an emission side 21.

A plurality of radiation-emitting components according to the invention are fixed on the side of the carrier opposite to the emission side, in each case a part of the housing body 80 of a radiation-emitting component in accordance with FIG. 4 projecting into one of the holes 20 and the emission direction 24 running through the holes 20.

The connection strips 2a, 2b of the respective leadframes of the components lie on the surface of the carrier 19 opposite to the emission side 21. Adhesive bonding connections or soldering connections may serve for fixing the components. On account of the leadframe which is formed in planar fashion and, in particular, has no bends, the space requirement horizontally and vertically is significantly smaller than in the case of components according to the prior art. In particular, the invention enables a partly recessed mounting of the components.

On account of the deformation elements 3a, 3b formed for example as spring strips in the leadframe, the leadframe is sufficiently flexible to absorb strains and deformations elastically or plastically without harmful strains being transmitted to the housing or a radiation-emitting chip situated therein. This mounting arrangement is suitable in particular for densely packed flat display modules.

Preferably, the carrier or at least the emission-side surface is embodied such that it is radiation-absorbent, for example blackened, thereby increasing the contrast of the individual radiation-emitting components with respect to the surroundings. This is advantageous particularly in the case of multiple arrangements which are provided as a display apparatus.

FIG. 6 shows a further multiple arrangement of components according to the invention. In contrast to the preceding multiple arrangement, the multiple arrangement shown in FIG. 6 is suitable in particular as background illumination, for example for a liquid crystal display.

As in the previous exemplary embodiment, radiation-emitting components according to the invention are mounted in partly recessed fashion on a carrier 19. On the emission side, a diffusing plate 22 is arranged downstream of the carrier or the components. Furthermore, the carrier 19 or at least the emission-side surface of the carrier 19 is preferably embodied such that it is uniformly diffusely reflective, for example white. This enables a largely homogeneous backlighting in an extremely flat design. Arranged downstream of the diffusing plate is, for example, an LCD display 23 to be illuminated.

The carrier may be formed both, as described above, rigidly and flexibly, for example in the form of a plastic or a ceramic film, so that a backlighting or display module can be adapted in a simple manner to different forms and advantageously even be mounted at changing areas.

The leadframe can be provided with a mechanically and/or chemically treated surface, or with a surface coating, for improving the soldering or bonding properties. For example, such surface improvements can be made by applying a surface coating of copper.

It goes without saying that the explanation of the invention on the basis of the exemplary embodiments shown is not be understood as a restriction of the invention. However, for example, the chip may be mounted, for example adhesively bonded, directly on a chip mounting area of the housing base body 8 and the chip may be electrically connected to the leadframe exclusively by means of wire connections. The chip may equally be mounted on a separate thermal connection embedded in the housing body, and again be electrically connected to the leadframe by means of wire connections. All these embodiments do not depart from the fundamental concept of the present invention.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A leadframe for a surface-mountable radiation-emitting component, having a chip connection region and an external soldering connection strip electrically connected to the the chip connection region,
   wherein the leadframe is adapted to be mounted in a mounting plane of a component housing, comprising:
   a deformation element formed between the chip connection region and the soldering connection strip, which deformation element runs substantially in a plane of the soldering connection strip, and enables a movement of the soldering connection strip relative to the chip connection region in a direction parallel to the mounting plane of the component housing, and
   a holding element disposed between the deformation element and the chip connection region for fixing the chip connection region in the component housing wherein the holding element is a hole or a cutout in the region between the deformation element and the chip connection region, and is adapted such that the component housing engages therein.

2. The leadframe as claimed in claim 1, wherein the deformation element is a spring element.

3. The leadframe as claimed in claim 1, wherein a further holding element is arranged between the chip connection region and the holding element.

4. The leadframe as claimed in claim 1, wherein the deformation element or the soldering connection strip has a guide part, which is adapted to be supported, in particular by the component housing, so that it acts against a bending of the soldering connection strip, in particular toward the front side of the component housing.

5. The leadframe as claimed in claim 4, wherein said guide part is a lug.

6. The leadframe as claimed in claim 1, wherein the leadframe is formed in planar fashion.

7. The leadframe as claimed in claim 1, wherein the leadframe has two external connection strips.

8. The leadframe as claimed in claim 7, wherein a deformation element is arranged between each of the external connection strips and the associated chip connection region.

9. The leadframe as claimed in claim 1, wherein the deformation element comprises a spring strip, whose strip width is less than the width of the adjoining connection strip.

10. The leadframe as claimed in claim 9, wherein the spring strip runs transversely with respect to the main direction of extent of the leadframe.

11. The leadframe as claimed in claim 1, wherein the chip connection region comprises a chip mounting part and a wire connection part arranged at a distance therefrom.

12. The leadframe as claimed in claim 1, wherein the connection strip, the deformation element and a partial region of the chip connection region that is assigned to the deformation element of the leadframe are formed in one piece.

13. The leadframe as claimed in claim 1, wherein the leadframe comprises a mechanically and/or chemically treated surface, or is provided with a surface coating which improves the soldering or bonding properties.

14. A housing for a radiation-emitting surface-mountable component, wherein the housing contains at least one leadframe as claimed in claim 1.

15. The housing as claimed in claim 14, wherein the leadframe is embedded in a housing body in such a way that the external connection strip and at least partly the deformation element project from the housing body.

16. The housing as claimed in claim 14, wherein at least one guide element, in particular a guide projection or a guide groove, is provided at the housing body and cooperates with the guide part of the leadframe.

17. The housing as claimed in claim 16, wherein the guide element is arranged at the housing base body, in particular is integrally formed with the housing base body.

18. The housing as claimed in claim 16, wherein the housing body or the housing base body has a projection as guide element, said projection overlapping the deformation element or soldering connection strip to be supported.

19. The housing as claimed in claim 14, wherein the housing body has a housing base body in which the leadframe is embedded in such a way that the external connection strip and at least partly the deformation element project from the housing base body.

20. The housing as claimed in claim 19, wherein the housing base body has an essentially circular or oval cross-sectional form parallel to the plane of the soldering connection strip.

21. The housing as claimed in claim 19, wherein the housing base body is produced from a molding compound.

22. The housing as claimed in claim 14, wherein the housing body is produced from a molding compound.

23. The housing as claimed in claim 14, wherein the housing has a radiation exit window, in which the chip connection region of the leadframe is arranged.

24. The housing as claimed in claim 23, adapted to accommodate a radiation source arranged in said radiation exit window, wherein said radiation exit window is bounded at least partly by side areas which are formed in such a way that they act as a radiation reflector at least for part of a radiation emitted by the radiation source.

25. The housing as claimed in claim 14, wherein
the deformation element or the soldering connection strip has a guide part which is adapted to be supported, in particular by the component housing, in such a way that it acts against a bending of the soldering connection strip, in particular toward the front side of the housing; and
the housing body or the housing base body has a groove into which projects the guide part of the deformation element or of the soldering connection strip.

26. A surface-mountable radiation-emitting component, comprising a housing as claimed in claim 14.

27. The housing as claimed in claim 14, wherein the housing body is at least partly produced from a thermoplastic material.

28. A surface-mountable radiation-emitting component, comprising a leadframe as claimed in claim 1.

29. The radiation-emitting component as claimed in claim 28, wherein the component housing has a housing base body, and a radiation-emitting chip is fixed in the chip connection region on the leadframe or on the housing base body.

30. The radiation-emitting component as claimed in claim 29, wherein the radiation-emitting chip is a semiconductor chip.

31. The radiation-emitting component as claimed in claim 29, wherein the chip is at least partly encapsulated with a radiation-transmissive compound, in particular a plastics compound.

32. The radiation-emitting component as claimed in claim 31, wherein the radiation-transmissive compound is a casting resin or a molding compound based on a reaction resin, in particular an epoxy resin, acrylic resin or silicone resin or a mixture of said resins.

33. An arrangement having a plurality of radiation-emitting components as claimed in claim 28, further comprising a carrier with a plurality of holes and the radiation-emitting components are in each case fixed with the connection strips at a component side of the carrier in such a way that their housing body or housing base body in each case projects into or through one of the holes.

34. The arrangement as claimed in claim 33, wherein the carrier has an emission side which is situated at the carrier's side opposite to the component side, and the components project into or through the holes in each case with their front side.

35. The arrangement as claimed in claim 34, wherein the emission-side surface of the carrier is radiation-absorbent, in particular blackened.

36. The arrangement as claimed in claim 34, wherein the emission-side surface of the carrier is diffusely reflective, in particular white.

37. The arrangement as claimed in claim 34, wherein a diffusing plate is arranged downstream of the carrier on the emission side.

38. The arrangement as claimed in claim 34, wherein a liquid crystal display is arranged downstream of the carrier on the emission side.

39. The arrangement as claimed in claim 33, wherein the carrier is formed in flexible fashion.

40. The arrangement as claimed in claim 33, wherein electrical conduction structures are formed on the carrier.

* * * * *